United States Patent [19]

Nakamura et al.

[11] Patent Number: 5,073,904
[45] Date of Patent: Dec. 17, 1991

[54] DIGITAL SIGNAL PROCESSING TYPE DEMODULATION METHOD AND DEMODULATION CIRCUIT

[75] Inventors: Shigeki Nakamura; Yasufumi Takahashi, both of Yokohama, Japan

[73] Assignee: Hitachi, Ltd., Tokyo, Japan

[21] Appl. No.: 354,918

[22] Filed: May 22, 1989

[30] Foreign Application Priority Data

May 25, 1988 [JP] Japan .................. 63-125704

[51] Int. Cl.⁵ .................. H03D 1/00; H04L 27/06
[52] U.S. Cl. .................. 375/94; 329/311
[58] Field of Search .................. 375/94, 96, 80, 75, 375/103, 97, 111; 341/110; 329/304, 311

[56] References Cited

U.S. PATENT DOCUMENTS 4,794,341 12/1988 Barton et al. .................. 375/96

FOREIGN PATENT DOCUMENTS 60-183841 9/1985 Japan .

OTHER PUBLICATIONS

Hideo Suzuki, et al., "Modem and FEC LSIs for Small Earth Stations", Lecture No. 2325, Collection of Papers in 1987 All Japan Meeting of the Institute of Electronics, Information and Communication Engineers of Japan.

"Application of Digital Signal Processing", Third Edition, the Institute of Electronics and Communication Engineers of Japan, Jul. 10, 1983, Chapter 6, p. 169.

Primary Examiner—Benedict V. Safourek
Assistant Examiner—Tesfaldet Bocure
Attorney, Agent, or Firm—Fay, Sharpe, Beall, Fagan, Minnich & McKee

[57] ABSTRACT

Disclosed is a digital demodulation technique in which a reception modulated-wave signal is converted into a digital signal in synchronism with a sampling frequency, whereafter carrier regeneration/detection is carried out upon the digital signal to thereby output a detection signal. Then, the detection signal is subject to interpolation and resampling on the basis of a clock frequency established asynchronously with and independently of the sampling frequency, so that a timing component is extracted from the detection signal in synchronism with the clock frequency to thereby output a reception data. In the digital demodulation technique, since the sampling frequency and the clock frequency are established asynchronously with and independently of each other, jitter or the like produced in clock regeneration do not affect the carrier regeneration/detection. Consequently, noiseless reception data with little jitters can be regenerated.

9 Claims, 5 Drawing Sheets

DIGITAL SIGNAL PROCESSING TYPE DEMODULATION METHOD AND DEMODULATION CIRCUIT

BACKGROUND OF THE INVENTION

The present invention relates to a demodulator for demodulating an input digital modulated wave, and, more particularly, relates to a digital signal demodulation circuit and a demodulation method of the digital signal processing type which are suitable for security of stable operation in a regeneration system under the condition of a low C/R or CNR (carrier-to-noise ratio) or in need of high-speed synchronization.

Heretofore, as systems for realizing a demodulator for demodulating an input digital modulated wave through digital signal processing, a system in which all circuits are synchronized with an operation sampling frequency has been mainly used as described in the paper entitled "Development of Small-Sized and Small-Capacity Earth Station Modulation/demodulation Portion LSIs", Lecture No. 2325, Collection of Papers in 1987 All Japan Meeting of the Institute of Electronics, Information and Communication Engineers of Japan.

Further, a system similar to that described above has been employed in a demodulator in a speech bandwidth wire modem, as described in the book entitled "Application of Digital Signal Processing", third edition, the Institute of Electronics and Communication Engineers of Japan, July 10, 1983, Chapter 6, Paragraph 6, Item 5, Page 169. In the aforementioned digital demodulators, the sampling frequency is synchronized with clocks extracted timely.

On the other hand, in a TDMA (time-division multiaccess) system which is one of multiplex communication systems used in satellite communication etc., burst operation of a demodulator is required. In this instance, it is required to shorten the synchronizing time in carrier regeneration and in clock regeneration for the purpose of improving the efficiency of use of circuits. To this end, particularly in clock regeneration, there has been proposed a method in which a phase difference is absorbed in a short time after reception of a burst wave. For example, there has been proposed a system in which a preceding burst frequency difference is stored in a memory, as described in JP-A-60-183841.

All of the aforementioned conventional techniques belong to the category of a demodulation system in which processing is carried out in synchronism with a sampling frequency which is synchronized with a clock extracted timely.

FIGS. 2 and 3 show typical examples of the aforementioned prior art demodulators.

In FIG. 2 a reception modulated-wave signal 21 is sampled/quantized by an A/D converter 22 and then fed to a carrier synchronization portion 24 through a reception waveform shaping filter 23. The waveform shaping filter 23 and the carrier synchronization portion 24 operate in synchronism with a sampling period. A regenerated clock is obtained by a clock synchronization portion 26 which performs extraction/ synchronization of a clock component of data rate from a reception data 25 detected by the carrier synchronization portion 24. The regenerated clock is used to provide a sampling frequency 28 for determining the timing of operations of the various systems.

In FIG. 2, in the case where jitters of the regenerated clock increase under the condition of a low C/N, the quantity of the jitters corresponds to the sampling period so that the input noise into the carrier synchronization portion increases. Because the synchronization system operates coherently to the data rate, the characteristics of the feedback system change in accordance with the data rate. Accordingly, it is necessary to set invariables for optimizing the characteristics for every data rate.

On the other hand, a demodulation system for performing burst operation suited to a TDMA system is shown in FIG. 3. In FIG. 3, a reception modulated-wave signal 31 is sampled/quantized by an A/D converter 32 and then fed to a detector 33 and a carrier regeneration portion 34 so as to obtain a detected reception data 41. In order to make the operation of the timing extraction/synchronization on the basis of the reception data 41 be suited to the burst reception, information of a frequency difference is stored in an integral term within a loop filter 36. The output of the loop filter 36 which performs a perfect quadratic operation is accumulated in an accumulating memory 37 which in turn generates a control signal for controlling the frequency dividing operation of a variable frequency divider 38. The output of the variable frequency divider 38 is compared with the reception data 41 in a phase comparator 35 which in turn generates information as to a phase difference. Thus, a loop of a clock regeneration system is constituted.

In this circuit configuration, similarly to the previous example, the timing extraction clock is synchronized with the sampling frequency. In this system, in the case where little frequency difference exists in the inter-burst clocks, there occurs no phase jumping in the sampling clock in reception of a burst wave. However, differences in clock phase as well as in frequency between reception burst waves transmitted from terminal stations cannot be neglected throughout the whole system. Accordingly, clock initial phase jumping occurs in burst reception, even though this system is stored in memories as information with respect to every station. Consequently, the initial phase jumping exerts a bad influence such as a calculation error upon the carrier synchronization system. Furthermore, as a matter of course, regenerated clock jitters appear in the form of superimposition upon regenerated carrier jitters, so that carrier slip, asynchronism and the like occur more frequently under the condition of a low C/N.

SUMMARY OF THE INVENTION

An object of the present invention is to provide a digital demodulation method and a digital demodulation circuit, in which jitters in a clock (timing) regeneration system do not affect a digital processing carrier regeneration system at all.

Another object of the present invention is to provide a digital demodulation method and a digital demodulation circuit, in which, in burst receiving operation, a timing phase difference setting jump or the like in a clock regeneration system does not affect a digital processing carrier regeneration system at all.

In the digital demodulation technique according to the present invention, the digital demodulation circuit comprises a digital processing carrier regeneration circuit and a clock regeneration circuit (which may be referred to as "timing regeneration circuit" or "timing extracting circuit").

In the digital demodulation technique according to the present invention, a reception modulated-wave signal is converted into a discrete digital signal in synchronism with a fixed sampling frequency by an A/D converter in the digital processing carrier regeneration circuit. The discrete digital signal is converted into a detection signal through carrier regeneration/detection in synchronism with the sampling frequency by a detector circuit in the digital processing carrier regeneration circuit.

Then, in the clock regeneration circuit, a timing component of transmission data is extracted from the detection signal in synchronism with a clock frequency (regeneration timing frequency) having characteristics asynchronous with and independent of the aforementioned sampling frequency, thereby obtaining a reception data.

As described above, in the digital demodulation technique according to the present invention, the sampling frequency in the digital processing carrier regeneration circuit and the clock frequency in the clock regeneration circuit are asynchronous with and independent of each other. The two asynchronous systems, that is to say, the digital processing carrier regeneration circuit and the clock regeneration circuit are integrated with each other through interpolation and resampling by means of an interpolation circuit, so that the detection signal is transmitted from the digital processing carrier regeneration circuit to the clock regeneration circuit to thereby regenerate a data.

As described above, in the digital demodulation technique according to the present invention, the setting of the sampling period and the setting of the clock period are made asynchronous with and independent of each other. Accordingly, jitters produced in the regeneration clock operation portion do not affect the sampling operation portion at all, so that there is no superimposition of jitters, and it is possible to obtain regenerated data having jitters a little or hardly having jitters.

In the burst-operation type demodulation using the aforementioned TDMA system, instantaneous phase jumping occurs when initial phase matching in the regeneration clock system is made on the basis of the estimated value of an initial phase difference. However, in the digital demodulation technique according to the present invention, the carrier regeneration is not affected so that noiseless regenerated data can be obtained.

Furthermore, the digital demodulation technique according to the present invention contributes to the standardization of a digital demodulation circuit.

DESCRIPTION OF THE PREFERRED EMBODIMENTS

Figure 4:
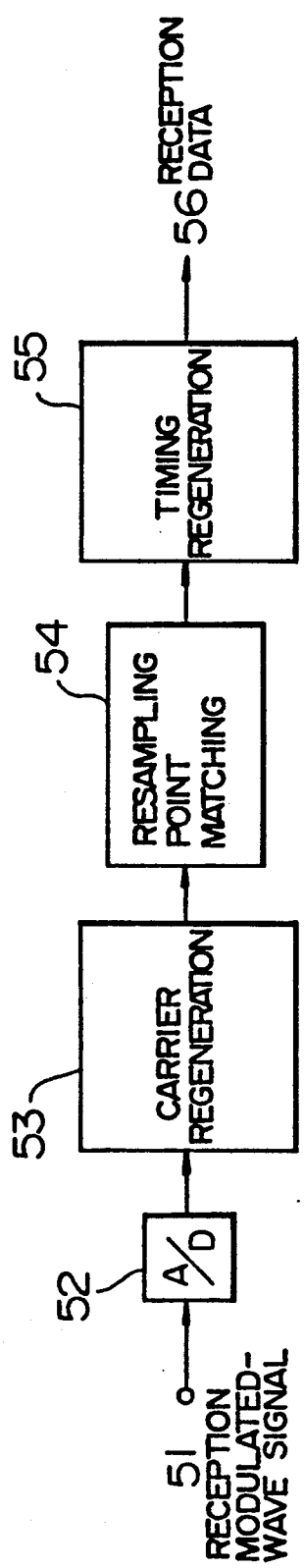
FIG. 4 is a diagram for explaining the present invention conceptually.

Referring to FIG. 4, first, an embodiment of the present invention will be described conceptually. In the configuration shown in FIG. 4, regeneration clock jitters produced in the timing extracting system do not affect the carrier regeneration system at all.

A reception modulated-wave signal 51 is converted by an A/D converter 52 into a discrete digital signal in synchronism with a fixed sampling frequency. The discrete digital signal is subject to carrier-component extraction and synchronization through a carrier regeneration system 53 so as to be further converted into a detection signal. In the carrier regeneration system 53, all the arithmetic operations are executed in synchronism with the sampling frequency, because the input signal is synchronous with the sampling frequency. Accordingly, the detection signal thus obtained is a discrete digital signal synchronized with the sampling frequency.

In the case where a timing regeneration system 55 is realized in a manner of digital processing, it is desirable to make the system to operate in synchronism with the regenerated clock. Accordingly, it is necessary that the input signal to the timing regeneration system 55 is synchronized with the regenerated clock. It is further necessary that timing jitters do not affect the carrier regeneration system 53 at all.

The independence between the carrier regeneration 53 and the timing regeneration 55 can be attained by using a process of estimating or resampling a signal from a series of input signals asynchronous with the regenerated clock at every point of time when the signal is in synchronism with the regenerated clock, that is to say, by using a resampling point matching procedure 54.

Figure 1:
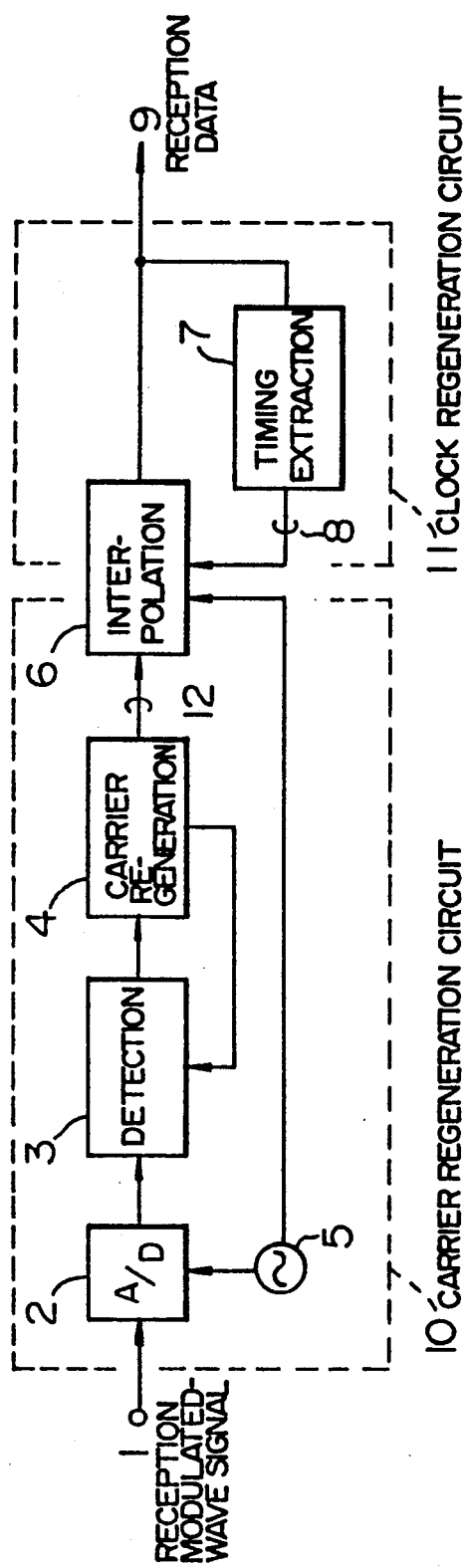
FIG. 1 is a diagram showing an embodiment of the digital demodulation circuit according to the present invention.
Figure 2:
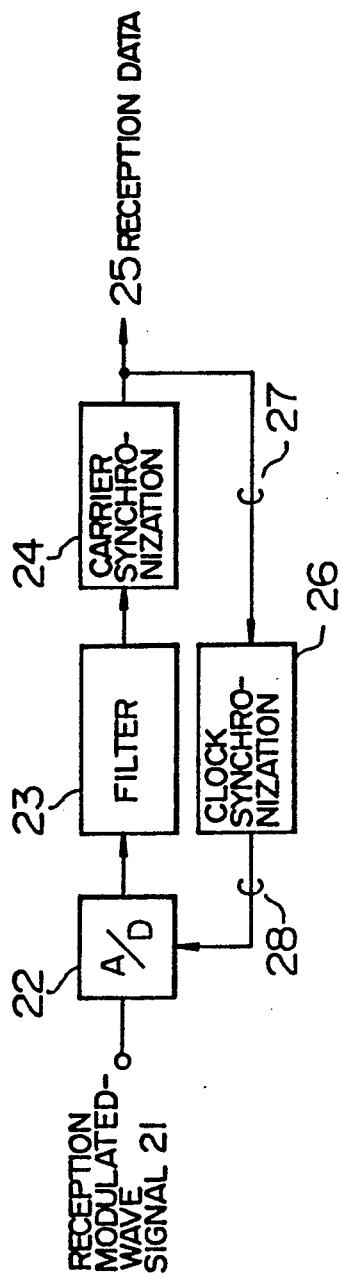
FIG. 2 is a diagram showing the configuration of a conventional digital processing demodulation system.
Figure 3:
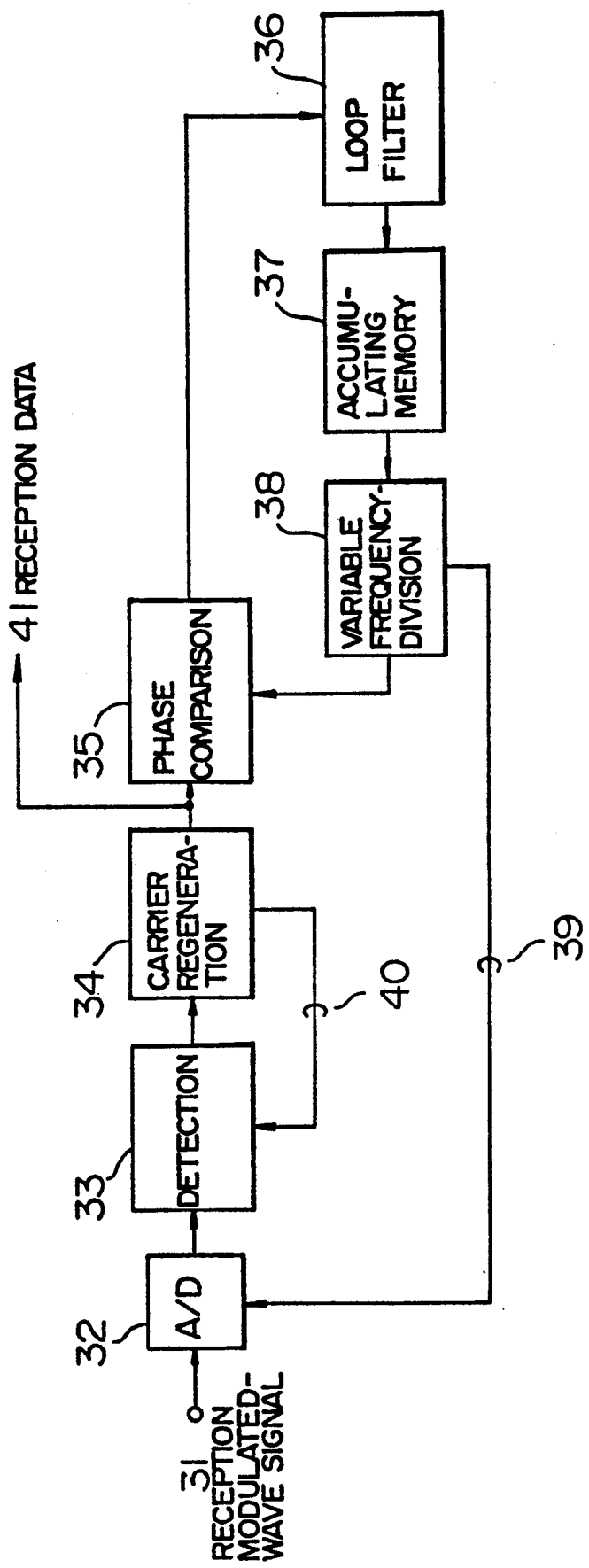
FIG. 3 is a diagram showing the configuration of a conventional demodulator having a bit synchronization circuit.

Next, referring to FIG. 1, an embodiment of the present invention will be described in detail hereunder. FIG. 1 shows the configuration of a digital demodulation circuit. A demodulation portion is constituted by a sampling operation portion (digital processing carrier regeneration circuit) 10 which operates in synchronism with a sampling period of an A/D converter 2, a regeneration clock operation portion (clock regeneration circuit) 11 which operates in synchronism with an extracted timing clock, and an interpolation processing portion 6 which serves as a signal interface between the asynchronous operations of the two portions 10 and 11.

Assume that a reception modulated-wave signal has been sampled with the frequency of an oscillator 5 so as to be subject to sufficient attenuation at the outside of a predetermined band so that a return cannot enter into the band.

The reception wave expressed as a sampling digital signal by the A/D converter 2 is converted from the band-pass signal into a base-band signal 12 by a detection circuit 3 on the basis of a carrier regenerated in a carrier regeneration 4. The detection circuit 3 is constituted by a digital multiplier and so on. For example, in the case where the reception modulated-wave signal is a digital four-phase phase-modulated wave, a loop suited to digitalization may be used as the carrier regeneration portion In such an instance, all the synchronous detection, phase comparison, loop filter and VCO are digitally operated in synchronism with the sampling period of the A/D converter 2.

As well known, several interpolation systems, such as a linear interpolation system, a high-degree interpolation system, etc., may be used for calculating a value at a desired point of time (at regenerated clock) from the detected discrete digital signal 12. As a further system, a method in which resampling is performed after a once conversion into an analog signal.

Figure 5:
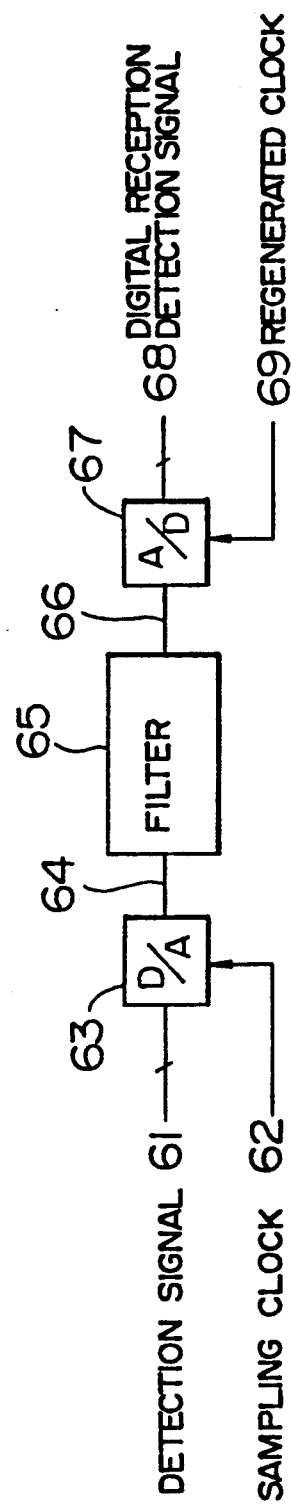
FIG. 5 is a diagram of an embodiment of the interpolation processing circuit for performing conversion through an analog conversion process according to the present invention.

FIG. 5 is a block diagram of an interpolation processing circuit for converting once a digital signal into an analog signal. A detection signal 61 synchronized with a sampling clock 62 in the carrier regeneration portion is converted into an analog signal 64 by a D/A converter 63. Then, harmonic components are removed from the analog signal 64 by the low-pass filter 65 to thereby obtain an analog reception detection signal 66. The thus obtained analog reception detection signal 66 is converted into a digital reception detection signal 68 synchronized with a regenerated clock 69 by the A/D converter 67. Accordingly, the interpolation processing circuit can be established independently of the carrier regeneration system.

Figure 6:
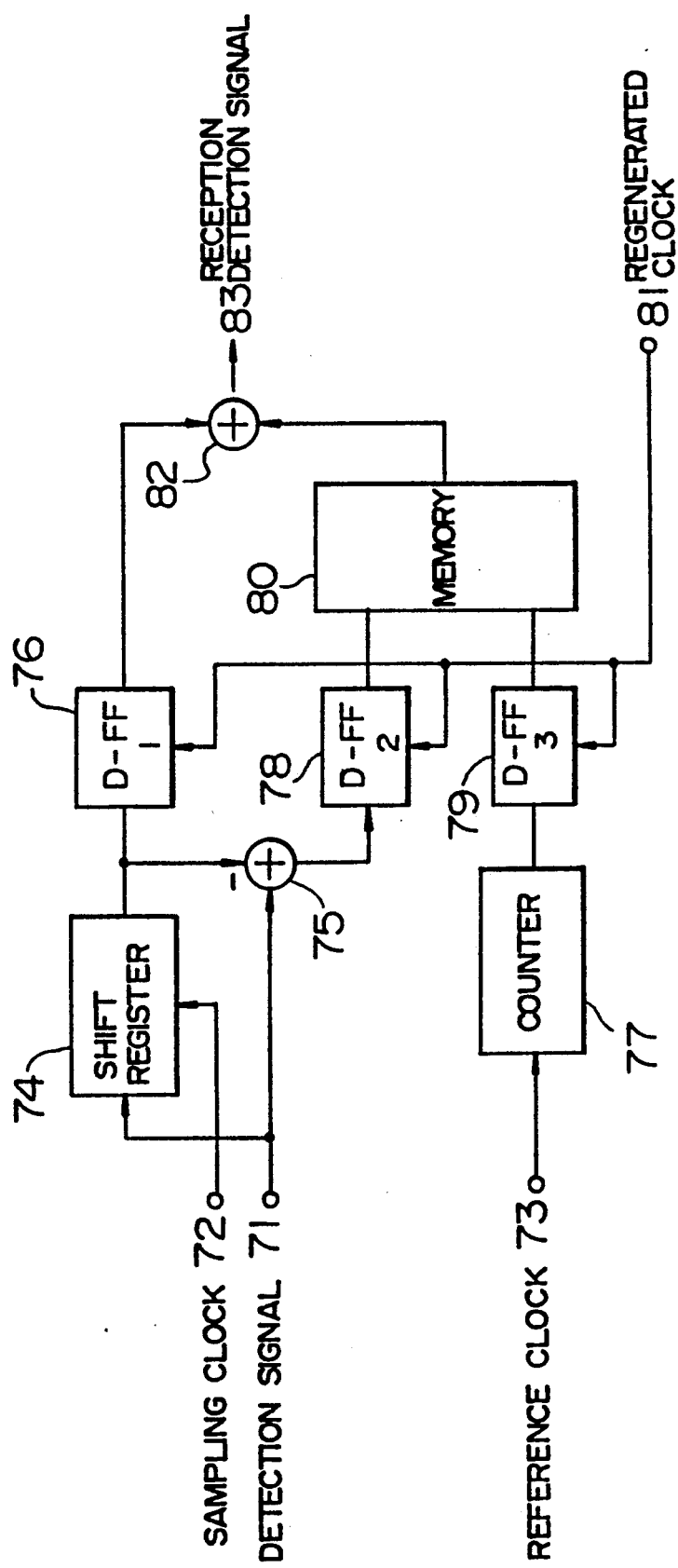
FIG. 6 a diagram of an embodiment of the linear interpolation processing circuit according to the present invention.

FIG. 6 is a block diagram of an example of a linear interpolation circuit. A subtracter 75 performs subtraction between the value of a detection signal 71 and the value of the detection signal but delayed by one sampling period by a one-state shift register 74, thereby calculating a difference between the values of the detection signal at the two points, that is, a current sampling point and a preceding sampling point one sampling period before. Assuming that the frequency of a reference clock 73 synchronized with a sampling clock 72 is N-times as high as the sampling clock, then the output of the N-division counter 77 represents a time between the two points as m/N. Accordingly, offset interpolation values from the two points can be obtained by accessing interpolation values previously stored in a memory 80 while calculating the difference value and the m/N value on the basis of a regenerated clock 81. The values are added to the value of the one-sample delayed signal by an adder 82 to thereby obtain a reception detection signal synchronized with the regenerated clock.

To perform high-degree interpolation, not lower than quadratic interpolation, the number of shift registers 74 and the number of subtracters 75 are increased from those shown in FIG. 6 so as to calculate a memory access value according to a quadratic or higher degree interpolation formula.

Figure 7:
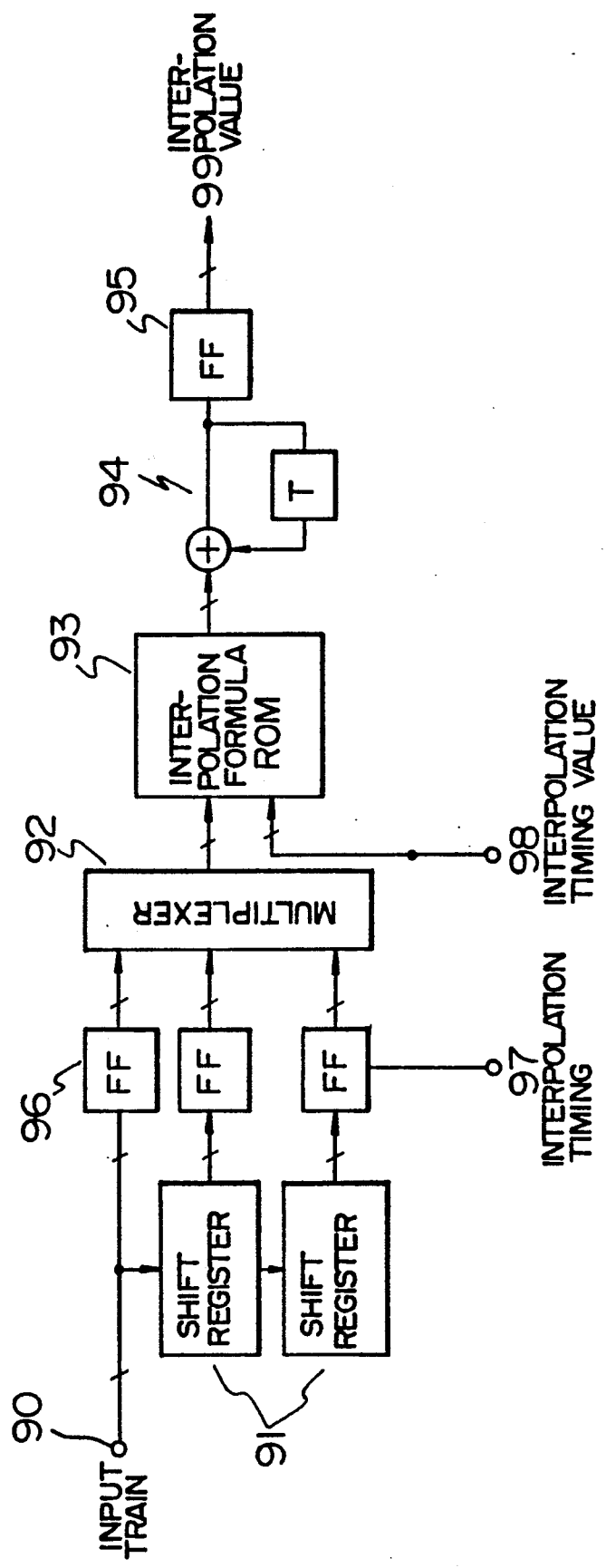
FIG. 7 is a diagram of an embodiment of the high-degree interpolation processing circuit.

FIG. 7 shows an embodiment of a high-degree interpolation processing circuit. In FIG. 7, the high-degree interpolation processing circuit is constructed so that quadratic interpolation is carried out on the basis of input values at three successive sampling points. A train of input values 90 are stored in shift registers 91 so that three input values at three successive sampling points successively delayed by one sampling period can be processed at the same time in parallel in synchronism with the sampling timing. In accordance with a timing 97 to perform interpolation, the three input values at the three successive sampling points at that timing are latched by respective flip-flop circuits 96 and then fed to a multiplexer 92 so as to be successively outputted from the multiplier 92 as a signal for addressing a ROM 93. The ROM 93 serves to provide an interpolation formula for calculating the interpolation value from the input value at each sampling point in accordance with the input point at each sampling point and a timing 98 as parameters. The formula is as follows.

Interpolation value from the value at each sampling
point = (Interpolation coefficient)
×(Interpolation timing) ×(Input value)

The interpolation values from the values at the three sampling points are converted into estimated values from the values at the three sampling points by an accumulator 94 in the next stage. The estimated values are subject to retiming through a flip-flop circuit 95 to thereby obtain interpolation values 99.

Furthermore, interpolation of a third degree or more can be realized in the same manner as described above by increasing the number of shift registers.

By using such an interpolation circuit as described above, data rate components are synchronously extracted in the timing extracting portion 7 from the signal series synchronized with the desired timing (regenerated clock 8) in the interpolation processing portion 6.

Although the embodiments illustrated in the specification and the drawings have shown the case where flip-flop circuits are used by way of example, it is a matter of course that the invention is not limited to the specific embodiments but the invention can be applied to the case where general latch circuits capable of performing latching operation may be used.

As shown clearly in FIG. 1, in the afore-mentioned embodiments, the sampling frequency generated by the oscillator 5 and the extracted regenerated-clock 8 are independent of each other. Accordingly, jitters produced from the regenerated clock operation portion 11 do not affect the sampling operation portion 10 at all.

In the burst-operation type demodulator corresponding to the TDMA system, or the like, instantaneous phase jumping occurs when initial phase matching is performed in the regeneration clock system on the basis of the estimated value of an initial phase difference. In the embodiments according to the present invention, however, the instantaneous phase jumping of the regeneration timing does not affect the A/D converter 2 at all. Accordingly, disadvantages due to the phase jumping, such as an arithmetic operation error, a phase comparison output offset in the carrier regeneration portion 4, and the like, can be prevented from occurring.

As described above, according to the present invention, a reception signal can be demodulated without being affected by jitters or the like in the clock regeneration system, even in the case where the carrier-to-noise ratio (C/N) deteriorates.

Further, the carrier regeneration system is not affected by phase jumping or the like caused by the necessity of high-speed synchronization, even though the invention is applied to the case where a burst wave is demodulated in a receiver of the TDMA system.

Further, a carrier regeneration system common to various data rates can be provided. In short, the characteristic of the regeneration system in the system according to the present invention can be determined regardless of such rates, though the characteristic of the regeneration system in the conventional method depends on such rates. Accordingly, there arises an effect in that the products can be standardized.

We claim:
1. A digital demodulation method comprising:

a first step of receiving a reception modulated-wave signal and regenerating and detecting a carrier from said reception modulated-wave signal in synchronism with a sampling frequency to thereby generate a first signal;

a second step of receiving said first signal and performing interpolation and resampling on said first signal in synchronism with a clock frequency established asynchronously with and independently of said sampling frequency to thereby generate a second signal; and a third step of receiving said second signal and extracting a timing component from said second signal in synchronism with a clock frequency established asynchronously with and independently of said sampling frequency to thereby generate a reception data.

2. A digital demodulation method according to claim 1, in which said second step comprises:

a step of receiving said first signal and delaying said first signal in synchronism with said sampling frequency to thereby generate a third signal;

a step of receiving said first and third signals and performing subtraction on said first and third signals to thereby generate a fourth signal in synchronism with a clock frequency established asynchronously with and independently of said sampling frequency, a step of synchronizing an output signal of a frequency-division counter with a clock frequency established asynchronously with and independently of said sampling signal to thereby generate a fifth signal;

a step of receiving said fourth and fifth signals into a memory and calculating an interpolation value according to an interpolation value calculating method previously stored in said memory to thereby generate a sixth signal;

a step of receiving said third signal and outputting said third signal as a seventh signal in synchronism with a clock frequency established asynchronously with and independently of said sampling signal; and a step of adding up sixth and seventh signals to thereby output the result of addition as said second signal.

3. The digital demodulation method according to claim 1, in which said second step comprises:

a step of converting said first signal to a plurality of signal outputs by delaying successive signals included in said first signal in synchronism with a sampling period;

a step of latching said plurality of signal outputs in synchronism with a clock frequency established asynchronously with and independently of said sampling signal;

a step of receiving said plurality of latched outputs in a multiplexer to thereby selectively output said plurality of signal outputs;

a step of calculating first interpolation values regarding each of said plurality of signal outputs outputted from said multiplexer according to a formula of interpolation;

a step of calculating a second interpolation value regarding said plurality of signal outputs by using said first interpolation values; and a step of latching said second interpolation value to thereby generate said second signal.

4. A digital demodulation method comprising:

a step of receiving a reception modulated wave signal and regenerating and detecting a carrier from said reception modulated-wave signal in synchronism with a sampling frequency to thereby generate a detection signal;

a step of converting said detection sign al into an analog signal;

a step of converting said analog signal into a digital signal in synchronism with a clock frequency established asynchronously with and independently of said sampling frequency; and a third step of receiving said digital signal and extracting a timing component from said digital signal in synchronous with a clock frequency established asynchronously with and independently of said sampling frequency to thereby generate a reception data.

5. A digital demodulation circuit comprising:

a digital processing carrier regeneration circuit for receiving a reception modulated-wave signal to regenerate and detect a carrier from said reception modulated-wave signal in synchronism with a sampling frequency to thereby generate a first signal;

an interpolation processing circuit for receiving said first signal, and for performing interpolation on said first signal and resampling said first signal in synchronism with a clock frequency established asynchronously with and independently of said sampling frequency to thereby generate a second signal; and a clock regeneration circuit for receiving said second signal and for extracting a timing component from said second signal in synchronism with said clock frequency to thereby generate a reception data.

6. A digital demodulation circuit according to claim 5, in which said interpolation processing circuit includes:

a shift register for delaying said first signal in synchronism with said sampling frequency;

a first latch circuit for latching the output of said shift register with a clock frequency established asynchronously with and independently of said sampling frequency to thereby generate a third signal;

a subtractor for performing subtraction between said first signal and the output of said shift register to thereby generate a fourth signal;

a second latch circuit for latching said fourth signal in synchronism with said clock frequency to thereby generate a fifth signal;

a frequency-division counter for generating a time between a sampling time of said first signal and a time to be interpolated;

a third latch circuit for latching the output of said frequency-division counter in synchronism with said clock frequency to thereby generate a sixth signal;

an accumulator for receiving said fifth and sixth signals to calculate an interpolation value according to a formula stored in said accumulator to thereby output the interpolation value as a seventh signal; and an adder for adding up said third and seventh signals to thereby output said reception data.

7. The digital demodulation circuit according to claim 5, in which said interpolation processing circuit includes:

a plurality of shift registers for delaying said first signal in synchronism with said sampling frequency;

a plurality of latch circuits for latching said first signal and the output signals of said plurality of shift registers in synchronism with a clock frequency established asynchronously with and independently of said sampling signal and for outputting the latched signals as output signals thereof;

a multiplexer for receiving the output signals of said plurality of latch circuits to thereby selectively output said output signals;

an interpolation formula ROM for calculating first interpolation values regarding each of said output signals outputted from said multiplexer according to a formula of interpolation;

an accumulator for calculating a second interpolation value regarding said output signals by using said first interpolation values and for outputting an output regarding said second interpolation value; and a latch circuit for latching the output of said accumulator and for outputting the latched output of said accumulator.

8. A digital demodulation circuit according to claim 5, in which said interpolation processing circuit includes:

a D/A converter for converting said first signal into an analog signal; and an A/D converter for converting said analog signal into a digital signal in synchronism with a clock frequency established asynchronously with and independently of said sampling frequency;

9. A digital demodulation circuit according to claim 8, in which said interpolation processing circuit further includes a low-pass filter for removing harmonic components from said analog signal.

* * * * *

UNITED STATES PATENT AND TRADEMARK OFFICE
CERTIFICATE OF CORRECTION

PATENT NO. : 5,073,904

DATED : December 17, 1991

INVENTOR(S) : Shigeki Nakamura, et al.

It is certified that error appears in the above-identified patent and that said Letters Patent is hereby corrected as shown below:

Claim 4, column 8, line 6, delete "sign al" and insert therefor --signal--.

Claim 4, column 8, line 14, delete "synchronous" and insert therefor --synchronism--.

Signed and Sealed this

Thirtieth Day of March, 1993

*Attest:*

STEPHEN G. KUNIN

*Attesting Officer*  *Acting Commissioner of Patents and Trademarks*